US012805306B2

(12) United States Patent
Nakashiba et al.

(10) Patent No.: US 12,805,306 B2
(45) Date of Patent: Nov. 17, 2026

(54) SEMICONDUCTOR DEVICE

(71) Applicant: RENESAS ELECTRONICS CORPORATION, Tokyo (JP)

(72) Inventors: Yasutaka Nakashiba, Tokyo (JP); Takayuki Igarashi, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 792 days.

(21) Appl. No.: 18/174,942

(22) Filed: Feb. 27, 2023

(65) Prior Publication Data

US 2023/0335487 A1 Oct. 19, 2023

(30) Foreign Application Priority Data

Apr. 14, 2022 (JP) ................................ 2022-066689

(51) Int. Cl.

| | |
|---|---|
| ***H10W 20/40*** | (2026.01) |
| ***H01F 19/08*** | (2006.01) |
| ***H01F 27/28*** | (2006.01) |
| ***H01F 27/29*** | (2006.01) |
| ***H01F 27/36*** | (2006.01) |

(Continued)

(52) U.S. Cl.

CPC .......... *H10W 20/497* (2026.01); *H01F 19/08* (2013.01); *H01F 27/2804* (2013.01); *H01F 27/288* (2013.01); *H01F 27/2885* (2013.01); *H01F 27/292* (2013.01); *H01F 27/363* (2020.08); *H01F 38/14* (2013.01); *H10D 1/20* (2025.01); *H10W 42/60* (2026.01); *H10W 72/90* (2026.01); *H01F 2019/085* (2013.01); *H01F 2027/2809* (2013.01); *H01F 2038/143* (2013.01); *H10W 72/59* (2026.01); *H10W 72/865* (2026.01); *H10W 72/884* (2026.01); *H10W 90/756* (2026.01)

(58) Field of Classification Search

CPC ............... H01F 27/2804; H01F 27/288; H01F 27/2885; H01F 27/292; H01F 27/363; H01F 2027/2809; H01F 19/08; H01F 2019/085; H01F 38/14; H01F 2038/143; H10W 20/497; H10W 42/60; H10W 44/501

See application file for complete search history.

(56) References Cited

U.S. PATENT DOCUMENTS

| | | | |
|---|---|---|---|
| 8,665,054 | B2 | 3/2014 | Stecher et al. |
| 8,716,832 | B2 | 5/2014 | Kerber |

(Continued)

FOREIGN PATENT DOCUMENTS

| | | | |
|---|---|---|---|
| DE | 102013206900 | A1 | 11/2013 |
| JP | 2013-149940 | A | 8/2013 |
| JP | 2021-082673 | A | 5/2021 |

OTHER PUBLICATIONS

Office Action issued in corresponding Japanese Patent Application No. 2022-066689, dated Apr. 22, 2025.

(Continued)

*Primary Examiner* — Marcos D. Pizarro
(74) *Attorney, Agent, or Firm* — Rimon P.C.

(57) ABSTRACT

An inductor to which a first potential is applied is surrounded by a first wiring connected with the inductor, and a pad connected with a second wiring, to which a second potential different from the first potential is applied, is disposed outside the second wiring such that the first wiring is surrounded by the second wiring.

8 Claims, 11 Drawing Sheets

(51) Int. Cl.

| | |
|---|---|
| ***H01F 38/14*** | (2006.01) |
| ***H10D 1/20*** | (2025.01) |
| ***H10W 42/60*** | (2026.01) |
| ***H10W 72/00*** | (2026.01) |
| ***H10W 72/59*** | (2026.01) |
| ***H10W 72/90*** | (2026.01) |
| ***H10W 90/00*** | (2026.01) |

(56) References Cited

U.S. PATENT DOCUMENTS

| | | | | |
|---|---|---|---|---|
| 2013/0278372 | A1 | 10/2013 | Stecher et al. | |
| 2018/0308795 | A1 | 10/2018 | Uchida et al. | |
| 2018/0366409 | A1 | 12/2018 | Kuwabara et al. | |
| 2021/0151394 | A1 | 5/2021 | Uchida et al. | |
| 2024/0021598 | A1* | 1/2024 | Tanaka .................... | H02M 1/08 |

OTHER PUBLICATIONS

Office Action dated on Mar. 7, 2024 issued in the corresponding German Patent Application No. 10 2023 202 815.8, w/ English Translation.

* cited by examiner

SEMICONDUCTOR DEVICE

CROSS-REFERENCE TO RELATED APPLICATIONS

The disclosure of Japanese Patent Application No. 2022-066689 filed on Apr. 14, 2022 including the specification, drawings and abstract is incorporated herein by reference in its entirety.

BACKGROUND

The present invention relates to a semiconductor device, and, for example, to an effective technique applicable to a semiconductor device capable of performing signal transmission between different potentials, by use of a pair of inductors which is inductively coupled with each other.

There are disclosed techniques listed below.

[Patent Document 1] Japanese Unexamined Patent Application Publication No. 2021-82673

Patent Document 1 discloses such a technique that reduces dielectric breakdown in a digital isolator (micro-isolator).

SUMMARY

For example, there is a transformer (micro-isolator) that makes it possible to perform signal transmission in an electrically non-contact state by use of a pair of inductors which is inductively coupled with each other. This transformer allows for signal transmission in an electrically non-contact state, providing an advantage of preventing an adverse effect of an electrical noise from one circuit to another circuit. In addition, in such a transformer configured above, improvement in dielectric strength has been demanded such that signal transmission between circuits having potentials which are greatly different from each other in an electrically non-contact state can also be achieved.

According to one embodiment of the present disclosure, a semiconductor device includes a multilayer wiring layer, a lower inductor formed in the multilayer wiring layer, an upper inductor formed on the multilayer wiring layer so as to overlap with the lower inductor, in plan view, a first wiring formed on the multilayer wiring layer so as to surround the upper inductor, in plan view, and a second wiring formed on the multilayer wiring layer so as to surround the first wiring, in plan view. Here, the first wiring is configured such that a first reference potential is applied thereto, and the second wiring is configured such that a second reference potential different from the first reference potential is applied thereto. Then, the first wiring includes first side and a second side each extending in a first direction, and a third side and a fourth side each extending in a second direction intersecting with the first direction. Also, the second wiring includes a fifth side and a sixth side each extending in the first direction, and a seventh side and an eighth side each extending in the second direction.

According to the one embodiment of the present disclosure, reliability of a semiconductor device can be enhanced.

DETAILED DESCRIPTION

The same components are denoted by the same reference symbols throughout all the drawings for describing the embodiments in principle, and the repetitive description thereof will be omitted. Also, hatching may be used even in plan view so as to make the drawings easy to see.

Circuit Configuration

Figure 1:
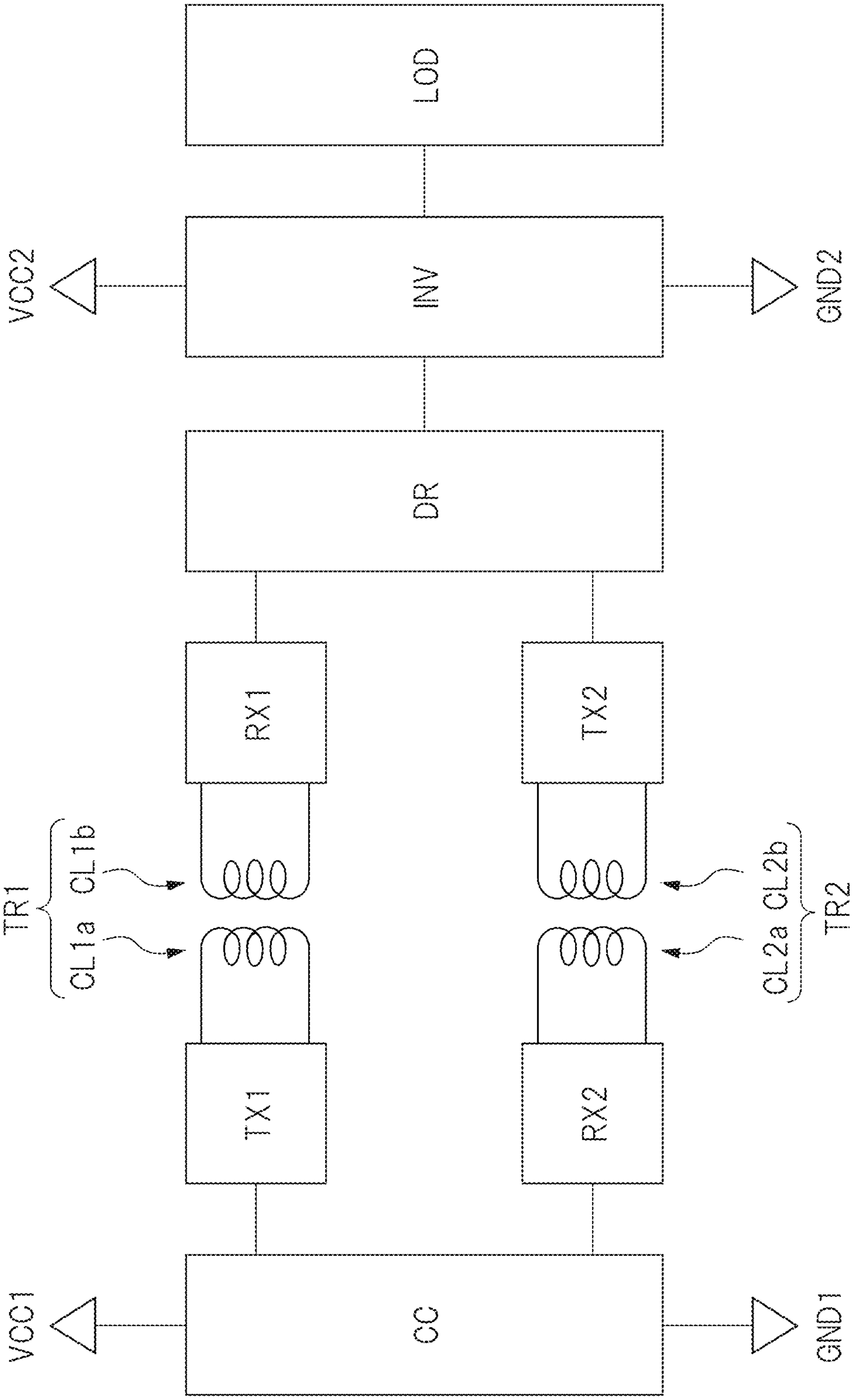
FIG. 1 is a diagram showing a configuration example of a drive control unit that drives a load circuit.

FIG. 1 is a diagram showing a configuration example of a drive control unit that drives a load circuit such as a motor. As shown in FIG. 1, the drive control unit includes a control circuit CC, a transformer TR1, a transformer TR2, a drive circuit DR, and an inverter INV, and is electrically connected with a load circuit LOD.

A transmitting circuit TX1 and a receiving circuit RX1 are circuits configured to transmit a control signal output from the control circuit CC to the drive circuit DR. In contrast, a transmitting circuit TX2 and a receiving circuit RX2 are circuits configured to transmit a signal output from the drive circuit DR to the control circuit CC. The control circuit CC is a circuit having a function of controlling the drive circuit DR. The drive circuit DR is a circuit configured to operate the inverter INV that controls the load circuit LOD according to control from the control circuit CC.

The control circuit CC is supplied with a power supply potential VCC1, and the control circuit CC is connected to a ground potential GND1. Meanwhile, the inverter INV is supplied with a power supply potential VCC2, and the inverter INV is connected to a ground potential GND2. At this time, for example, the power supply potential VCC1 is smaller than the power supply potential VCC2 supplied to the inverter INV. In other words, the power supply potential VCC2 supplied to the inverter INV is larger than the power supply potential VCC1.

Between the transmitting circuit TX1 and the receiving circuit RX1, there is interposed a transformer TR1 including a coil (inductor) CL1_a_ and a coil CL1_b_ which are inductively coupled (magnetically coupled) with each other. Accordingly, a signal can be transmitted from the transmitting circuit TX1 to the receiving circuit RX1 via the transformer TR1. As a result, the drive circuit DR can receive the control signal output from the control circuit CC via the transformer TR1.

Thus, the transformer TR1 which is electrically isolated by using inductive coupling makes it possible to transmit the control signal from the control circuit CC to the drive circuit DR, preventing transmission of electrical noise from the control circuit CC to the drive circuit DR. Owing to this, an erroneous motion of the drive circuit DR attributable to overlapping of an electrical noise with the control signal can be prevented, resulting in enhancement of operation reliability of a semiconductor device.

The coil CL1*a* and the coil CL1*b* constituting the transformer TR1 each function as an inductor. The transformer TR1 functions as a magnetic coupling element including the coil CL1*a* and the coil CL1*b* which are inductively coupled with each other.

Similarly, between the transmitting circuit TX2 and the receiving circuit RX2, there is interposed a transformer TR2 including the coil CL2*b* and the coil CL2*a* which are inductively coupled with each other. Accordingly, a signal can be transmitted from the transmitting circuit TX2 to the receiving circuit RX2 via the transformer TR2. As a result, the control circuit CC can receive the signal output from the drive circuit DR via the transformer TR2.

Thus, the transformer TR2 which is electrically isolated by using inductive coupling makes it possible to transmit the signal from the drive circuit DR to the control circuit CC, preventing transmission of electrical noise from the drive circuit DR to the control circuit CC. Owing to this, an erroneous motion of the control circuit CC attributable to overlapping of an electrical noise with the signal can be prevented, resulting in enhancement of operation reliability of a semiconductor device.

The transformer TR1 includes the coil CL1*a* and the coil CL1*b*, and the coil CL1*a* and the coil CL1*b* are not connected with each other with a conductor interposed therebetween and are magnetically coupled with each other. Owing to this, when current flows through the coil CL1*a*, an induced electromotive force is generated in the coil CL1*b* according to change in the current, and inductive current flows therein. At this time, the coil CL1*a* is a primary coil, and the coil CL1*b* is a secondary coil. In this manner, the transformer TR1 uses electromagnetic induction phenomenon that is generated between the coil CL1*a* and the coil CL1*b*. That is, when the signal is transmitted from the transmitting circuit TX1 to the coil CL1*a* of the transformer TR1 and causes current to flow through the coil CL1*a*, inductive current is generated in the coil CL1*b* of the transformer TR1 and detected by the receiving circuit RX1, so that the receiving circuit RX1 can receive the signal corresponding to the control signal output from the transmitting circuit TX1.

Similarly, the transformer TR2 includes the coil CL2*a* and the coil CL2*b*, and the coil CL2*a* and the coil CL2*b* are not connected with each other with a conductor interposed therebetween and are magnetically coupled with each other. Owing to this, when current flows through the coil CL2*b*, an induced electromotive force is generated in the coil CL2*a* according to change in the current, and inductive current flows therein. In this manner, when the signal is transmitted from the transmitting circuit TX2 to the coil CL2*b* of the transformer TR2 and causes current to flow through the coil CL2*b*, inductive current is generated in the coil CL2*a* of the transformer TR2 and detected by the receiving circuit RX2, so that the receiving circuit RX2 can receive the signal corresponding to the control signal output from the transmitting circuit TX2.

Transmission and reception of signals are performed between the control circuit CC and the drive circuit DR through a path from the transmitting circuit TX1 through the transformer TR1 to the receiving circuit RX1 and a path from the transmitting circuit TX2 through the transformer TR2 to the receiving circuit RX2. That is, the signal transmitted by the transmitting circuit TX1 is received by the receiving circuit RX1, and the signal transmitted by the transmitting circuit TX2 is received by the receiving circuit RX2, allowing for transmission and reception of signals between the control circuit CC and the drive circuit DR. As described above, signal transmission from the transmitting circuit TX1 to the receiving circuit RX1 is performed with the transformer TR1 interposed therebetween, and signal transmission from the transmitting circuit TX2 to the receiving circuit RX2 is performed with the transformer TR2 interposed therebetween. Accordingly, the drive circuit DR can drive the inverter INV for operating the load circuit LOD, according to the signal transmitted from the control circuit CC.

The control circuit CC and the drive circuit DR are different in voltage level of a reference potential from each other. That is, in the control circuit CC, the reference potential is fixed to the ground potential GND1, and as shown in FIG. 1, the drive circuit DR is electrically connected with the inverter INV. The inverter INV has, for example, a high-side IGBT (Insulated Gate Bipolar Transistor) and a low-side IGBT. Also, the drive circuit DR performs ON/OFF control on the high-side IGBT and ON/OFF control on the low-side IGBT in the inverter INV, so that control on the load circuit LOD by the inverter INV is achieved. In particular, ON/OFF control on the high-side IGBT is performed by the drive circuit DR controlling a potential to be applied to a gate electrode of the high-side IGBT. Similarly, ON/OFF control on the low-side IGBT is performed by the drive circuit DR controlling a potential to be applied to a gate electrode of the low-side IGBT.

Here, for example, ON control on the low-side IGBT is achieved by applying “an emitter potential (0 V)+a threshold voltage (15 V)” to the gate electrode thereof with the emitter potential (0 V) of the low-side IGBT that is connected to the ground potential GND2 as a reference. In contrast, for example, OFF control on the low-side IGBT is achieved by applying the “emitter potential (0 V)” to the gate electrode thereof with the emitter potential (0 V) of the low-side IGBT that is connected to the ground potential GND2 as the reference. Accordingly, ON/OFF control on the low-side IGBT is performed, based on whether or not to apply the threshold voltage (15 V) to the gate electrode thereof with 0 V as the reference potential.

In contrast, for example, with the emitter potential of the high-side IGBT as the reference potential, ON control on the high-side IGBT is also performed, based on whether or not to apply the “reference potential+threshold voltage (15 V)” to the gate electrode thereof. However, the emitter potential of the high-side IGBT is not necessarily fixed to the ground potential GND2, unlike the case of the emitter potential of the low-side IGBT. That is, in the inverter INV, the high-side IGBT and the low-side IGBT are connected in series with each other between the power supply potential VCC2 and the ground potential GND2. Moreover, in the inverter INV, such a control is performed that the low-side IGBT is turned off when the high-side IGBT is turned on and the low-side IGBT is turned on when the high-side IGBT is turned off. Accordingly, since the low-side IGBT is turned on when the high-side IGBT is turned off, the emitter potential of the high-side IGBT becomes the ground potential GND2 due to the low-side IGBT being turned on. In contrast, since the low-side IGBT is turned off when the high-side IGBT is turned on, the emitter potential of the high-side IGBT becomes the power supply potential VCC2. At this time, ON/OFF control on the high-side IGBT is performed, based on whether or not to apply, with the emitter potential of the high-side IGBT as the reference potential, the “reference potential+threshold voltage (15 V)” to the gate electrode thereof.

As described above, the emitter potential of the high-side IGBT varies depending on a case in which the high-side IGBT is turned on or a case in which the high-side IGBT is turned off. That is, the emitter potential of the high-side IGBT varies in a range from the ground potential GND2 (0 V) to the power supply potential VCC2 (for example, 800 V). Accordingly, to turn on the high-side IGBT, with the emitter potential of the high-side IGBT as the reference potential, the "reference potential (800 V)+threshold voltage (15 V)" is required to be applied to the gate electrode thereof. In view of this, in the drive circuit DR that performs ON/OFF control on the high-side IGBT, there is a need to grasp the emitter potential of the high-side IGBT. Accordingly, the drive circuit DR is configured to input the emitter potential of the high-side IGBT. As a result, the reference potential of 800 V is input to the drive circuit DR, and the drive circuit DR applies the threshold voltage of 15 V in addition to this reference potential of 800 V to the gate electrode of the high-side IGBT, thereby controlling such that the high-side IGBT is turned on. Accordingly, a high potential of approximately 800 V is applied to the drive circuit DR.

Thus, the drive control unit has the control circuit CC that deals with a low potential (several tens of volts) and the drive circuit DR that deals with a high potential (several hundreds of volts). Owing to this, signal transmission between the control circuit CC and the drive circuit DR needs to be performed between the circuits having different potentials.

In this regard, signal transmission between the control circuit CC and the drive circuit DR is performed interposing the transformer TR1 and the transformer TR2, so that signal transmission between the circuits having different potentials can be performed.

As described above, in the transformer TR1 and the transformer TR2, a large potential difference may be generated between the primary coil and the secondary coil. In other words, since a large potential difference may be generated, the primary coil and the secondary coil which are magnetically coupled with each other without interposing a conductor therebetween are used for signal transmission. Accordingly, upon formation of the transformer TR1, from a viewpoint of improving operation reliability of a semiconductor device, it is important to increase a dielectric strength between the coil CL1*a* and the coil CL1*b* as high as possible. Similarly, upon formation of the transformer TR2, from a viewpoint of improving operation reliability of a semiconductor device, it is important to increase a dielectric strength between the coil CL2*b* and the coil CL2*a* as high as possible.

Example of Signal Transmission

Figure 2:
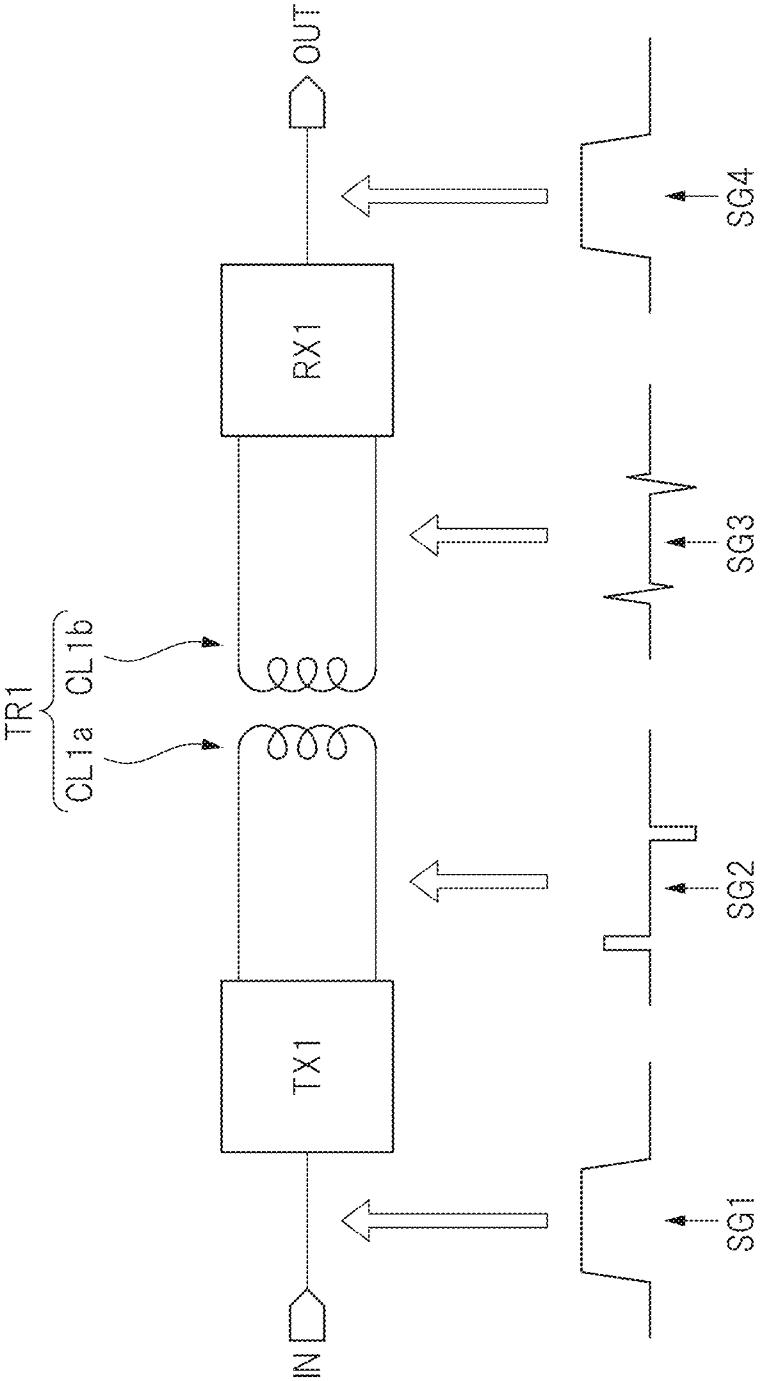
FIG. 2 is an explanatory diagram showing an example of signal transmission.

FIG. 2 is an explanatory diagram showing an example of signal transmission. In FIG. 2, the transmitting circuit TX1 extracts an edge portion of a square wave signal SG1 input to the transmitting circuit TX1 to generate a signal SG2 having a fixed pulse width and sends the signal SG2 to the coil CL1*a* (primary coil) of the transformer TR1. When a current attributable to this signal SG2 flows through the coil CL1*a* (primary coil) of the transformer TR1, a signal SG3 flows in the coil CL1*b* (secondary coil) of the transformer TR1 in response to the current due to an induced electromotive force. This signal SG3 is amplified by the receiving circuit RX1 and further modulated in a square wave shape, and accordingly, a square wave signal SG4 is output from the receiving circuit RX1. Thus, the signal SG4 corresponding to the signal SG1 input to the transmitting circuit TX1 can be output from the receiving circuit RX1. In this manner, it is possible to transmit a signal from the transmitting circuit TX1 to the receiving circuit RX1. Similarly, it is also possible to transmit a signal from the transmitting circuit TX2 to the receiving circuit RX2.

Two-Chip Configuration

Figure 3:
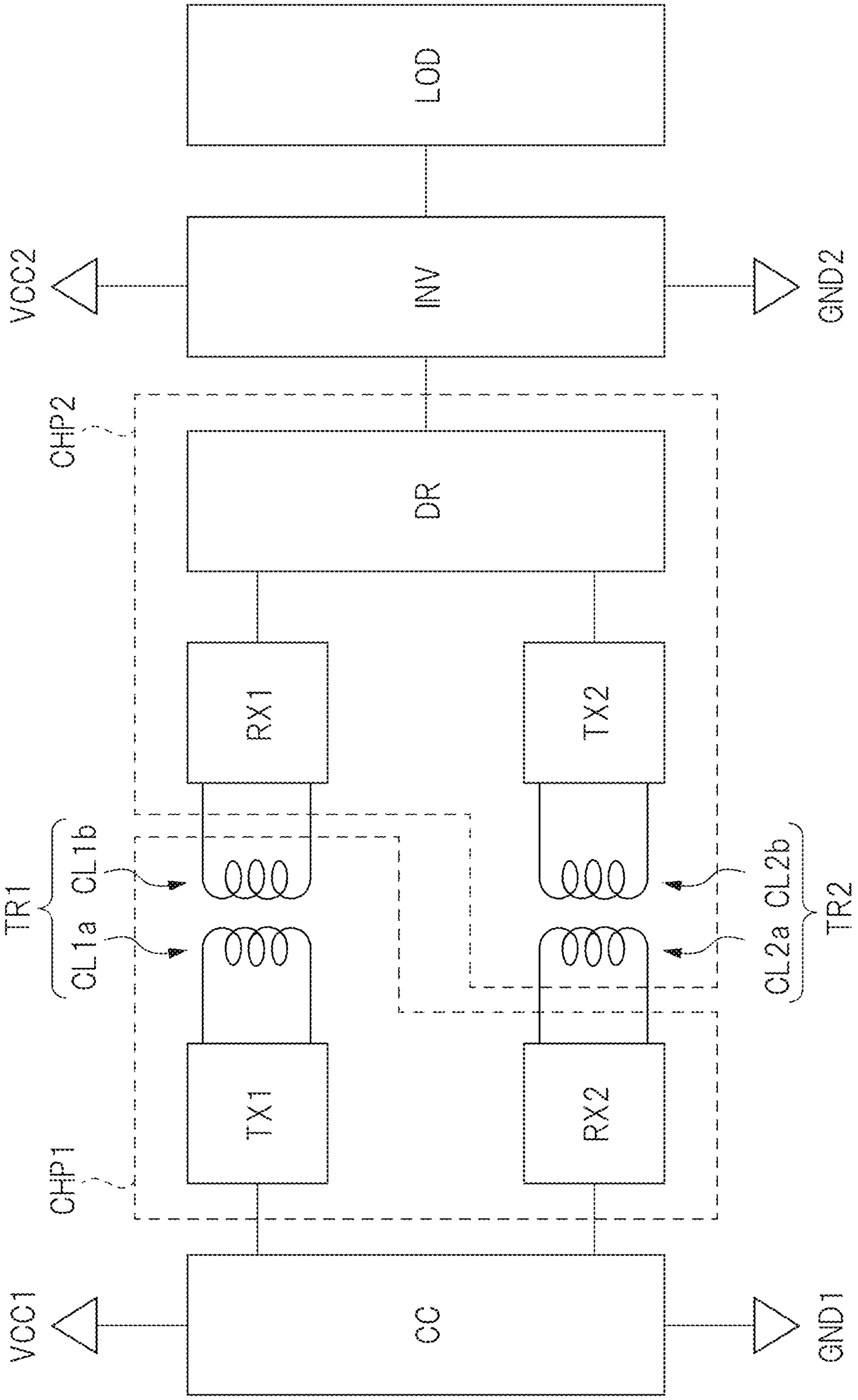
FIG. 3 is a diagram showing a two-chip configuration.

The transmitting and receiving circuits of the drive control unit described above are formed in two separate semiconductor chips, for example. In particular, FIG. 3 is a diagram showing a two-chip configuration. In FIG. 3, a semiconductor chip CHP1 has the transmitting circuit TX1, the transformer TR1, and the receiving circuit RX2 formed therein. Meanwhile, the semiconductor chip CHP2 has the receiving circuit RX1, the drive circuit DR, the transmitting circuit TX2, and the transformer TR2 formed therein. In such a two-chip configuration, for example, the transformer TR1 is formed in the same semiconductor chip CHP1 in which the transmitting circuit TX1 and the receiving circuit RX2 are formed. Accordingly, integration of the transformer TR1, the transmitting circuit TX1, and the receiving circuit RX2 can be achieved. Similarly, the transformer TR2 is formed in the same semiconductor chip CHP2 in which the drive circuit DR, the receiving circuit RX1, and the transmitting circuit TX2 are formed. Accordingly, integration of the transformer TR2, the drive circuit DR, the receiving circuit RX1, and the transmitting circuit TX2 can be achieved.

However, in the two-chip configuration, for example, the transformer TR1, the transmitting circuit TX1, and the receiving circuit RX2 need to be formed in one semiconductor chip, causing a manufacturing process of the semiconductor chip CHP1 to become more complicated. Similarly, in the two-chip configuration, for example, the transformer TR2, the drive circuit DR, the receiving circuit RX1, and the transmitting circuit TX2 need to be formed in one semiconductor chip, causing a manufacturing process of the semiconductor chip CHP2 to become more complicated. As a result, manufacturing costs of the semiconductor chip CHP1 and the semiconductor chip CHP2 increase.

Three-Chip Configuration

In view of this, it has been conducted such a study that the transmitting and receiving circuits described above may be formed in not the two-chip configuration, but the three-chip configuration. In the following description, a novel three-chip configuration will be described.

Figure 4:
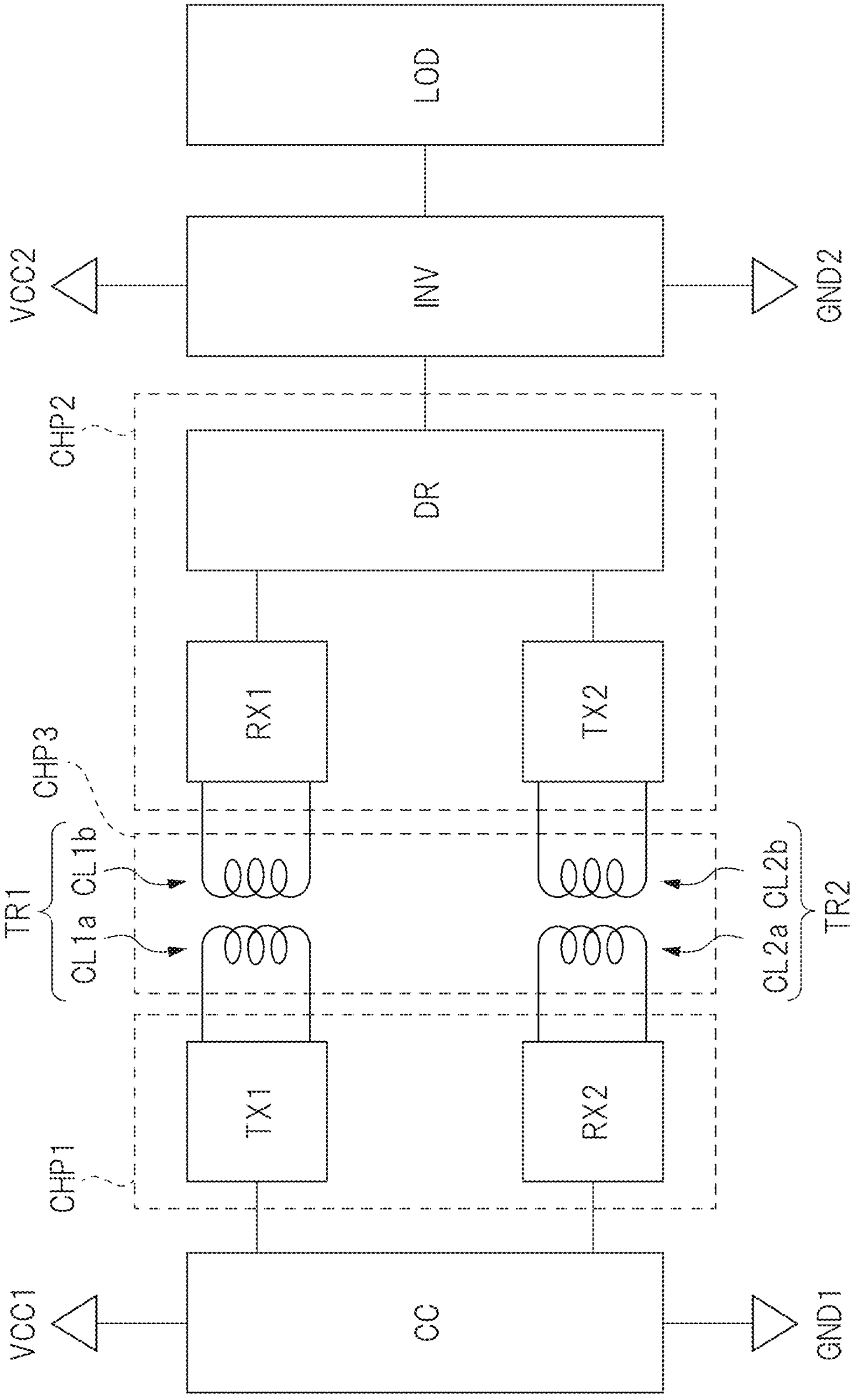
FIG. 4 is a diagram showing a three-chip configuration.

FIG. 4 is a diagram showing a three-chip configuration. In FIG. 4, the semiconductor chip CHP1 has the transmitting circuit TX1 and the receiving circuit RX2 formed therein. In addition, the semiconductor chip CHP2 has the drive circuit DR, the receiving circuit RX1, and the transmitting circuit TX2 formed therein. Meanwhile, the semiconductor chip CHP3 has the transformer TR1 and the transformer TR2 formed therein.

Thus, the three-chip configuration has the semiconductor chip CHP3 in which the transformer TR1 and the transformer TR2 only are formed. That is, in the three-chip configuration, regardless of how each of the semiconductor chip CHP1 and the semiconductor chip CHP2 is configured, it is possible to use the semiconductor chip CHP3. Owing to this, the three-chip configuration provides an advantage of allowing variations of the semiconductor chip CHP1 and the semiconductor chip CHP2 which are usable to be increased. In other words, versatility of the semiconductor chip CHP3 in which the transformer TR1 and the transformer TR2 are formed can be enhanced. Moreover, since the semiconductor chip CHP3 in which the transformer TR1 and the transformer TR2 are formed does not include a transistor, the semiconductor chip CHP3 can be formed through a wiring step only, resulting in achievement of simplification of the manufacturing process. Accordingly, according to the three-chip configuration, the manufacturing costs can be reduced, and therefore, a highly competitive product can be manufactured.

Configuration of Semiconductor Chip According to Related Art

In the following description, a configuration of the semiconductor chip CHP3 based on the three-chip configuration according to a related art will be described. The “related art” referred to in the present specification is not a well-known technique, but a technique having a problem found by the present inventor and serving as a basis of the present invention of this application.

Figure 5:
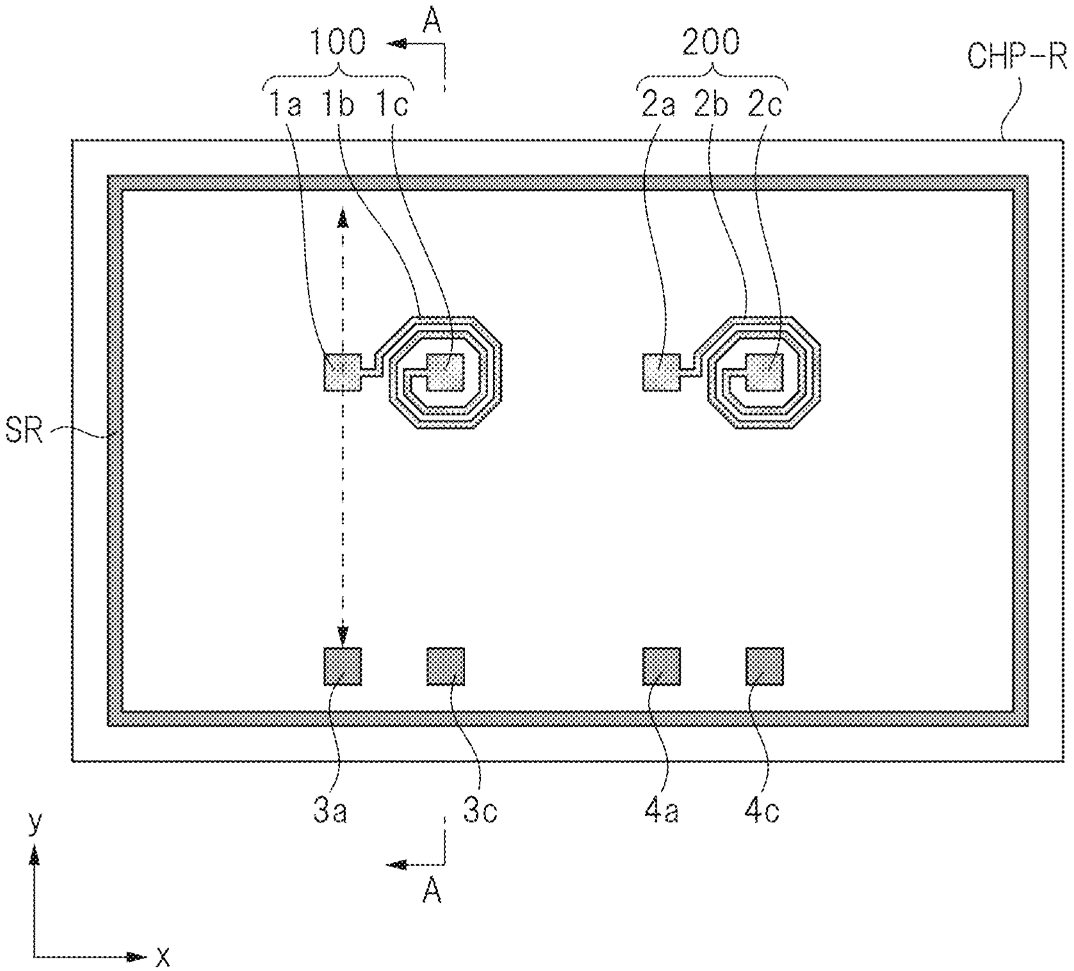
FIG. 5 is a plan view showing a semiconductor chip according to a related art.

FIG. 5 is a plan view showing a semiconductor chip CHP-R according to a related art.

In FIG. 5, a planar shape of the semiconductor chip CHP-R is rectangular, and at a peripheral edge portion of the semiconductor chip CHP-R, a sealing ring SR is provided. Also, in plan view, an upper inductor 100 and an upper inductor 200 are provided in such a manner as to be surrounded by the sealing ring SR. Here, the upper inductor 100 has a tap pad 1*a*, a spiral wiring 1*b* connected with the tap pad 1*a*, and a transformer pad 1*c* connected with the spiral wiring 1*b*. Similarly, the upper inductor 200 has a tap pad 2*a*, a spiral wiring 2*b* connected with the tap pad 2*a*, and a transformer pad 2*c* connected with the spiral wiring 2*b*.

In addition, a tap pad 3*a*, a transformer pad 3*c*, a tap pad 4*a*, and a transformer pad 4*c* are provided in such a manner as to be surrounded by the sealing ring SR, in plan view. The tap pad 3*a* and the transformer pad 3*c* are a tap pad and a transformer pad of a lower inductor (not shown) that is formed under the upper inductor 100, respectively. That is, the lower inductor that is a pair of the upper inductor 100 is formed under the upper inductor 100, and the tap pad 3*a* and the transformer pad 3*c* drawn from this lower inductor via wirings are formed in the same layer as the upper inductor 100.

Similarly, the tap pad 4*a* and the transformer pad 4*c* are a tap pad and a transformer pad of another lower inductor (not shown) that is formed under the upper inductor 200. That is, the lower inductor that is a pair of the upper inductor 200 is formed under the upper inductor 200, and the tap pad 4*a* and the transformer pad 4*c* drawn from this lower inductor via wirings are formed in the same layer as the upper inductor 200.

Here, for example, a reference potential of approximately 800 V is applied to the upper inductor 100 and the upper inductor 200. In contrast, a reference potential of approximately 0 V is applied to the lower inductor (the tap pad 3*a* and the transformer pad 3*c*) and the lower inductor (the tap pad 4*a* and the transformer pad 4*c*). That is, the reference potential different from the reference potential applied to the upper inductor 100 is applied to the lower inductor that is a pair of the upper inductor 100. Similarly, the reference potential different from the reference potential applied to the upper inductor 200 is applied to the lower inductor that is a pair of the upper inductor 200.

Figure 6:
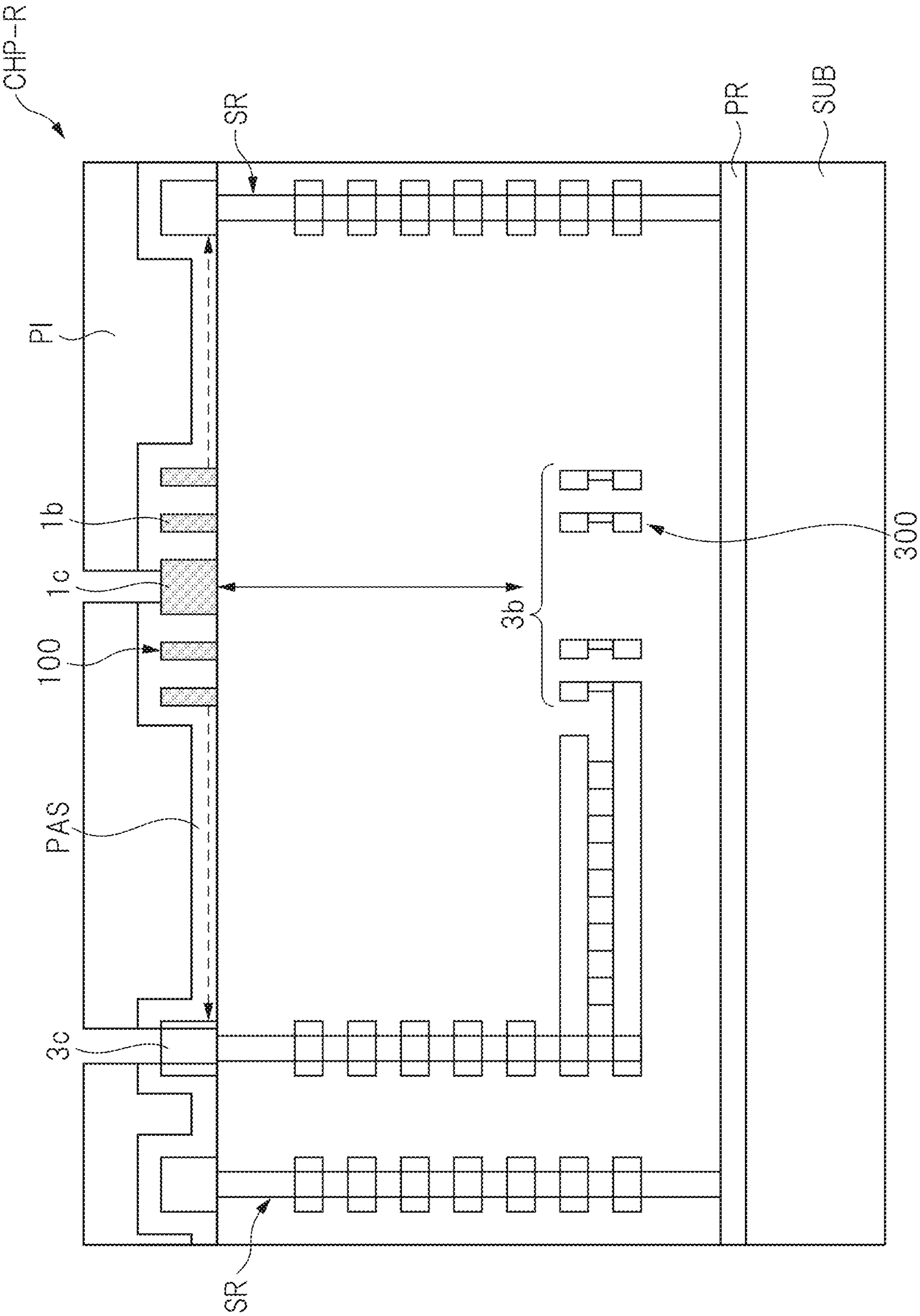
FIG. 6 is a cross-sectional view of the semiconductor chip shown in FIG. 5, taken along an A-A line.

Next, FIG. 6 is a cross-sectional view of the semiconductor chip shown in FIG. 5, taken along an A-A line.

In FIG. 6, for example, a p-type semiconductor region PR having an impurity concentration higher than that of a p-type semiconductor substrate SUB is formed on a front surface of the p-type semiconductor substrate SUB, and a multilayer wiring layer is formed over this p-type semiconductor region PR. Also, the multilayer wiring layer has the sealing ring SR formed therein. In addition, in the multilayer wiring layer, a lower inductor 300 having a spiral wiring 3*b* is formed. From this lower inductor 300 (spiral wiring 3*b*), wirings formed in the multilayer wiring layer are drawn, and the spiral wiring 3*b* is electrically connected with the transformer pad 3*c* formed in the uppermost layer of the multilayer wiring layer. That is, the lower inductor 300 is electrically connected with the transformer pad 3*c* and other tap pads (not shown) via the wirings formed in the multilayer wiring layer.

Moreover, over the multilayer wiring layer, the upper inductor 100 is formed. That is, the upper inductor 100 is formed above the lower inductor 300, and this upper inductor 100 has the spiral wiring 1*b* and the transformer pad 1*c*.

Further, a passivation film PAS and a polyimide resin film PI are formed so as to cover the upper inductor 100. The passivation film PAS and the polyimide resin film PI have openings provided therein, and a portion of a front surface of the transformer pad 3*c* and a portion of a front surface of the transformer pad 1*c* are exposed in the openings. Note that the passivation film PAS includes a silicon oxide film and a silicon nitride film.

As described above, the semiconductor chip CHP-R according to the related art is configured.

Room for Improvement

Next, room for improvement that is present in the related art will be described.

In FIG. 5, for example, the reference potential of approximately 800 V is applied to each of the upper inductor 100 and the upper inductor 200, and the reference potential of approximately 0 V is applied to each of the sealing ring SR and the lower inductors (the tap pad 3*a*, the transformer pad 3*c*, the tap pad 4*a*, and the transformer pad 4*c*). That is, over the multilayer wiring layer, the constituent elements having different potentials are disposed in the same layer. As a result, for example, as indicated with dashed arrows in FIG. 5, discharge phenomenon called “creeping discharge” occurs between the upper inductor 100 to which the reference potential of approximately 800 V is applied and the sealing ring SR to which the reference potential of approximately 0 V is applied or the tap pad 3*a* to which the reference potential of approximately 0 V is applied. Thus, lowering of dielectric strength attributable to this “creeping discharge” becomes apparent as a problem. A description of this “creeping discharge” will further be given below.

In FIG. 6, the lower inductor 300 is disposed under the upper inductor 100. The reference potential of approximately 800 V is applied to the upper inductor 100, and the reference potential of approximately 0 V is applied to the lower inductor 300. Accordingly, as indicated with solid arrows in FIG. 6, in a direction in which the upper inductor 100 and the lower inductor 300 are opposed to each other, discharge between the upper inductor 100 and the lower inductor 300 is concerned. In this regard, a dielectric strength between the upper inductor 100 and the lower inductor 300 is referred to as an “intrinsic dielectric strength,” and this “intrinsic dielectric strength” can be controlled at a designed value. That is, a thickness of an interlayer insulating film is controlled, so that the “intrinsic dielectric strength” can be secured.

In contrast, not only the upper inductor 100, but also the transformer pad 3*c* that is electrically connected with the lower inductor 300 is formed over the multilayer wiring layer. Accordingly, over the multilayer wiring layer, the upper inductor 100 and the transformer pad 3*c* of the lower inductor 300 to which potentials different from each other are applied are formed in the same layer. Owing to this, as indicated with dashed arrows in FIG. 6, the "creeping discharge" occurs between the upper inductor 100 to which the reference potential of approximately 800 V is applied and the transformer pad 3*c* to which the reference potential of approximately 0 V is applied, and lowering of the dielectric strength attributable to the "creeping discharge" is concerned. This "creeping discharge" is liable to occur depending on a shape of the upper inductor 100 and a shape of the transformer pad 3*c*, and it is difficult to avoid the "creeping discharge" by setting a designed value.

In particular, in the three-chip configuration, the semiconductor chip CHP-R has only the inductor formed therein, and the upper inductor 100 and the tap pad 3*a* and the transformer pad 3*c* of the lower inductor 300, each of which has a different potential from each other applied thereto, are disposed close to each other in the same layer. Accordingly, the present inventor has newly found that, in the three-chip configuration, "creeping discharge" is likely to occur and lowering of the dielectric strength (galvanic withstand voltage) attributable to the "creeping discharge" becomes apparent as a problem.

The "creeping discharge" is defined as, for example, discharge phenomenon in which current flows between a pair of electrodes disposed on a front surface of an insulator along the front surface of the insulator when a high voltage is applied across the pair of electrodes. It has been known that the higher dielectric constant the insulator has, the more this "creeping discharge" is likely to occur, and this "creeping discharge" is likely to occur in a case in which an electrode is present also in a back surface of the insulator. A trigger point that causes this "creeping discharge" is referred to as a "singular point."

For example, in FIG. 5, a corner portion of a pad (the tap pad 1*a* or the tap pad 2*a*) or a bend portion of a spiral wiring (the spiral wiring 1*b* or the spiral wiring 2*b*) is likely to be a singular point. Moreover, an end point of a portion having a curvature (for example, a circle) also becomes a singular point. Accordingly, in the present specification, the "singular point" is defined as a portion which is likely to be a trigger point that causes the "creeping discharge," and, for example, examples of such a "singular point" can include an end point (end point of a circle, or the like) of a portion having a curvature or a corner portion.

As shown in FIG. 5, in the related art, since the singular point described above is present over the multilayer wiring layer on which the constituent elements having different potentials from each other are disposed, the "creeping discharge" is likely to occur, and lowering of the dielectric strength attributable to the "creeping discharge" becomes apparent as a problem. That is, in the related art, from a perspective of preventing the "creeping discharge" and enhancing the dielectric strength, there is room for improvement.

In view of this, in the present embodiment, an attempt to overcome room for improvement that is present in the related art is made. In the following, a technical idea in the present embodiment in which this attempt is made will be described.

Basic Idea According to Present Embodiment

The present inventor has found that, as a novel knowledge, prevention of the "creeping discharge" that occurs between the constituent elements having different potentials from each other and being formed in the same layer is achieved by surrounding a constituent element having a singular point by a shape having fewer singular points, and based on this knowledge, a basis idea is conceived of by the present inventor.

That is, the basic idea of the present embodiment is to surround a constituent element having a singular point with a wiring in a substantially quadrangular shape. In particular, the basic idea according to the present embodiment is, for example, an idea in which a first constituent element is surrounded by a first wiring in a substantially quadrangular shape which is connected with the first constituent element and to which a first potential is applied, this first wiring is surrounded by a second wiring in a substantially quadrangular shape to which a second potential different from the first potential is applied, and a second constituent element connected with the second wiring is disposed outside the second wiring.

In the following, an embodied mode achieved by embodying the above-described basic idea will be described.

Embodied Mode

Layout of Semiconductor Chip

Figure 7:
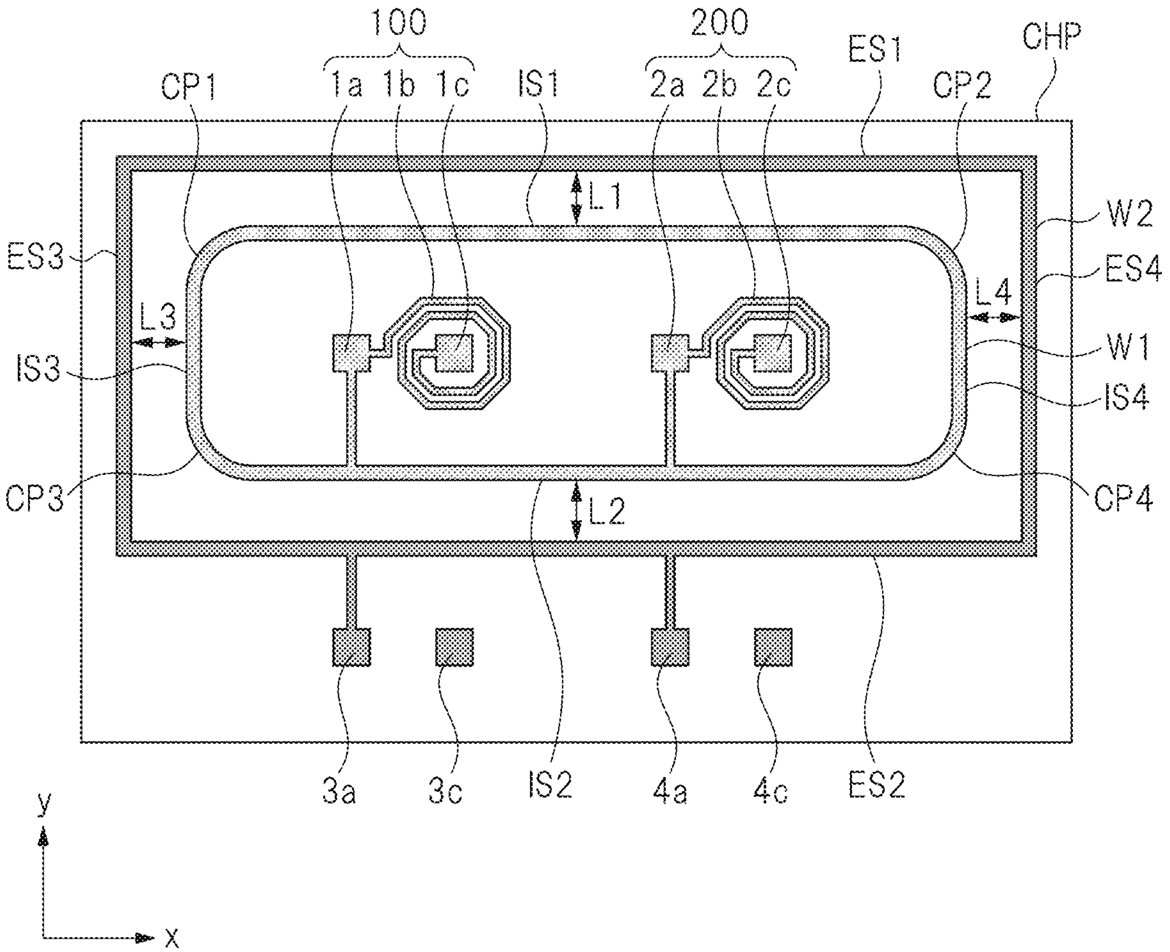
FIG. 7 is a planar layout of a semiconductor chip.

FIG. 7 is a planar layout of a semiconductor chip CHP.

In FIG. 7, the semiconductor chip CHP is a semiconductor chip having a micro-isolator (transformer) including an upper inductor and a lower inductor which are overlapped with each other, in plan view.

This semiconductor chip CHP has a rectangular planar shape, as shown in FIG. 7. In FIG. 7, an upper surface of a multilayer wiring layer provided in the semiconductor chip CHP is shown. Over the multilayer wiring layer provided in the semiconductor chip CHP, an upper inductor 100 and an upper inductor 200 are formed. The upper inductor 100 has a tap pad 1*a*, a spiral wiring 1*b* connected with the tap pad 1*a*, a transformer pad 1*c* connected with the spiral wiring 1*b*. Similarly, the upper inductor 200 has a tap pad 2*a*, a spiral wiring 2*b* connected with the tap pad 2*a*, a transformer pad 2*c* connected with the spiral wiring 2*b*. The upper inductor 100 and the upper inductor 200 are each formed so as to overlap with a corresponding lower inductor, in plan view.

In addition, over the multilayer wiring layer provided in the semiconductor chip CHP, a tap pad 3*a*, a transformer pad 3*c*, a tap pad 4*a*, and a transformer pad 4*c* are provided. The tap pad 3*a* and the transformer pad 3*c* are a tap pad and a transformer pad of the lower inductor (not shown) formed under the upper inductor 100, respectively. That is, the lower inductor that is a pair of the upper inductor 100 is formed under the upper inductor 100, and the tap pad 3*a* and the transformer pad 3*c* drawn from this lower inductor via wirings are formed in the same layer as the upper inductor 100. Similarly, the tap pad 4*a* and the transformer pad 4*c* are a tap pad and a transformer pad of the lower inductor (not shown) formed under the upper inductor 200, respectively. That is, the lower inductor that is a pair of the upper inductor 200 is formed under the upper inductor 200, and the tap pad 4*a* and the transformer pad 4*c* drawn from this lower inductor via wirings are formed in the same layer as the upper inductor 200.

Moreover, over the multilayer wiring layer provided in the semiconductor chip CHP, in plan view, a wiring W1 is formed to surround the upper inductor 100 and the upper inductor 200. This wiring W1 is, for example, configured such that a reference potential (first reference potential) of approximately 800 V is applied thereto and is electrically connected with the tap pad 1*a* of the upper inductor 100 and the tap pad 2*a* of the upper inductor 200. Specifically, via a connection wiring formed on the multilayer wiring layer, each of the tap pad 1*a* of the upper inductor 100 and the tap pad 2*a* of the upper inductor 200 applies the reference potential to the wiring W1. As a result, the wiring W1 and each of the upper inductor 100 and the upper inductor 200 are electrically connected, and the reference potential of approximately 800 V is applied to the wiring W1, the upper inductor 100, and the upper inductor 200.

In addition, over the multilayer wiring layer provided in the semiconductor chip CHP, in plan view, a wiring W2 surrounding the wiring W1 is formed. This wiring W2 is, for example, configured such that a reference potential (second reference potential) of approximately 0 V is applied thereto and is electrically connected with the tap pad 3*a* of the lower inductor that is a pair of the upper inductor 100 and the tap pad 4*a* of the lower inductor that is a pair of the upper inductor 200. Specifically, via a connection wiring formed on the multilayer wiring layer, each of the tap pad 3*a* and the tap pad 4*a* of the lower inductors applies the reference potential to the wiring W2. This connection wiring may be provided in the multilayer wiring layer. In particular, the tap pad 3*a* and the tap pad 4*a* are disposed outside the wiring W2. That is, one side of the wiring W2 is disposed between the wiring W1 and each of the tap pad 3*a* and the tap pad 4*a*. In this manner, the wiring W2 is electrically connected with the lower inductor that is a pair of the upper inductor 100 and with the lower inductor that is a pair of the upper inductor 200, and the reference potential of approximately 0 V is applied to the wiring W2, the lower inductor that is a pair of the upper inductor 100, and the lower inductor that is a pair of the upper inductor 200.

As described above, the wiring W1 and the wiring W2 are disposed in the same layer on the multilayer wiring layer. Also, the basic idea is embodied such that the wiring W1 in a substantially quadrangular shape connected with the upper inductor 100 and the upper inductor 200, to which the reference potential of approximately 800 V is applied, surrounds the upper inductor 100 and the upper inductor 200, this wiring W1 is surrounded by the wiring W2 in a substantially quadrangular shape, to which the reference potential of approximately 0 V is applied, and the tap pad 3*a* and the tap pad 4*a* which are connected with the wiring W2 are disposed outside the wiring W2.

Here, as shown in FIG. 7, the wiring W1 has a first internal side IS1 and a second internal side IS2 each extending in a first direction along the upper surface of the multilayer wiring layer, and a third internal side IS3 and a fourth internal side IS4 each extending in a second direction intersecting with the first direction and along the upper surface of the multilayer wiring layer. Here, the first direction and the second direction are preferably orthogonal to each other. That is, the wiring W1 includes the first internal side IS1, the second internal side IS2 parallel to the first internal side IS1, the third internal side IS3 intersecting with the first internal side IS1, and the fourth internal side IS4 parallel to the third internal side IS3. Moreover, the wiring W1 has a crossing portion CP1 where the first internal side IS1 and the third internal side IS3 intersect with each other, a crossing portion CP2 where the first internal side IS1 and the fourth internal side IS4 intersect with each other, a crossing portion CP3 where the second internal side IS2 and the third internal side IS3 intersect with each other, a crossing portion CP4 where the second internal side IS2 and the fourth internal side IS4 intersect with each other. At this time, each of the crossing portion CP1, the crossing portion CP2, the crossing portion CP3, and the crossing portion CP4 is in a shape having a curvature.

In contrast, as shown in FIG. 7, the wiring W2 has a first external side ES1 and a second external side ES2 each extending in the first direction along the upper surface of the multilayer wiring layer, and a third external side ES3 and a fourth external side ES4 each extending in the second direction intersecting with the first direction and along the upper surface of the multilayer wiring layer. That is, the wiring W2 includes the first external side ES1, the second external side ES2 that is opposed to the first external side ES1, the third external side ES3 that intersects with the first external side ES1, and the fourth external side ES4 that is opposed to the third external side ES3. At this time, the first external side ES1 is disposed so as to be parallel to the first internal side IS1, and the second external side ES2 is disposed so as to be parallel to the second internal side IS2. In addition, the third external side ES3 is disposed so as to be parallel to the third internal side IS3, and the fourth external side ES4 is disposed so as to be parallel to the fourth internal side IS4.

For example, in FIG. 7, in a case in which a distance between the first internal side IS1 and the first external side ES1 is set as a first distance L1, a distance between the second internal side IS2 and the second external side ES2 as a second distance L2, a distance between the third internal side IS3 and the third external side ES3 as a third distance L3, and a distance between the fourth internal side IS4 and the fourth external side ES4 as a fourth distance L4, the first distance L1, the second distance L2, the third distance L3, and the fourth distance L4 are equal to each other. For example, the first distance L1, the second distance L2, the third distance L3, and the fourth distance L4 are each approximately 200 μm.

Features of Embodied Mode

Next, features of the embodied mode will be described.

A first feature according to the embodied mode lies in such a point that, for example, as shown in FIG. 7, the wiring W1 in the substantially quadrangular shape connected with the upper inductor 100 and the upper inductor 200, to which the reference potential of approximately 800 V is applied, surrounds the upper inductor 100 and the upper inductor 200, and the wiring W2 in the substantially quadrangular shape, to which the reference potential of approximately 0 V is applied, surrounds this wiring W1, the tap pad 3*a* and the tap pad 4*a* that are connected with the wiring W2 are disposed outside the wiring W2. In other words, one side of the wiring W1 and one side of the wiring W2 which are opposed to each other are formed between the upper inductor (the upper inductor 100 and the upper inductor 200) and the tap pad (the tap pad 3*a* and the tap pad 4*a*). In FIG. 7, such a layout that the second internal side IS2 and the second external side ES2 are formed between the upper inductor and the tap pad is provided. However, for example, such a layout that the first internal side IS1 and the first external side ES1 are formed between the upper inductor and the tap pad may also be applicable.

Accordingly, for example, the dielectric strength between the reference potential of approximately 800 V and the reference potential of approximately 0 V is defined between the wiring W1 in the substantially quadrangular shape and the wiring W2 in the substantially quadrangular shape. That is, according to the first feature, the "creeping discharge" attributable to a singular point included in the shape of the inductor (the upper inductor 100 and the upper inductor 200) and the shape of the pad (the tap pad 3*a* and the transformer pad 3*c*, the tap pad 4*a* and the transformer pad 4*c*) is prevented. This is because the inductor having the singular point is surrounded by the wiring W1 in the substantially quadrangular shape, and as a result of this wiring W1 being surrounded by the wiring W2 in the substantially quadrangular shape, it is possible to prevent the singular points that are included in the inductor and the pad from being the trigger point of generating the "creeping discharge."

Also, according to the first feature, the wiring W1 in the substantially quadrangular shape and the wiring W2 in the substantially quadrangular shape surrounding this wiring W1 lead to formation of many portions that are parallel to each other, resulting in a configuration making it possible to hardly generate the "creeping discharge." Thus, according to the first feature, lowering of the dielectric strength (galvanic withstand voltage) attributable to the "creeping discharge" can be prevented, leading to enhancement of reliability of the semiconductor device.

Specifically, according to the first feature, a distance between the wiring W1 and the wiring W2 (the first distance L1, the second distance L2, the third distance L3, and the fourth distance L4 shown in FIG. 7) is adjusted, making it possible to effectively prevent the "creeping discharge." That is, according to the first feature, it may be only sufficient to prevent not the "creeping discharge" generated from the singular point, but the "creeping discharge" generated between the wiring W1 and the wiring W2. As a result, such an advantage that prevention of the "creeping discharge" is achieved by adjustment of the distance between the wiring W1 and the wiring W2 is obtained. In this regard, for example, the first distance L1, the second distance L2, the third distance L3, and the fourth distance L4 shown in FIG. 7 are set to be equal to each other, so that the "creeping discharge" can effectively be prevented. Note that, as long as the "creeping discharge" can effectively be prevented, the first distance L1, the second distance L2, the third distance L3, and the fourth distance L4 may not be set to be equal to each other. Depending on a layout of the semiconductor chip CHP, any one of the first distance L1, the second distance L2, the third distance L3, and the fourth distance L4 may be different. If the first distance L1, the second distance L2, the third distance L3, and the fourth distance L4 are set to be equal to each other, the "creeping discharge" can be prevented more effectively.

In addition, from a perspective of effectively preventing the "creeping discharge," it is preferable that a side constituting the wiring W1 and a side constituting the wiring W2, both of which are opposed to each other, are parallel to each other. However, as long as the "creeping discharge" can effectively be prevented, the present embodiment is not limited to the effect that these sides are parallel to each other. For example, regarding the side of the wiring W1 and the side of the wiring W2 which are opposed to each other, the side of the wiring W2 may be inclined to the side of the wiring W1.

Figure 8:
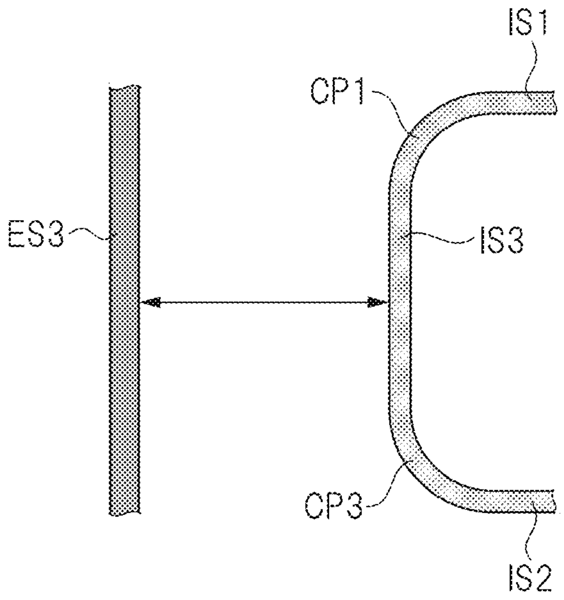
FIG. 8 is a view showing linear portions that are parallel with each other.
Figure 9:
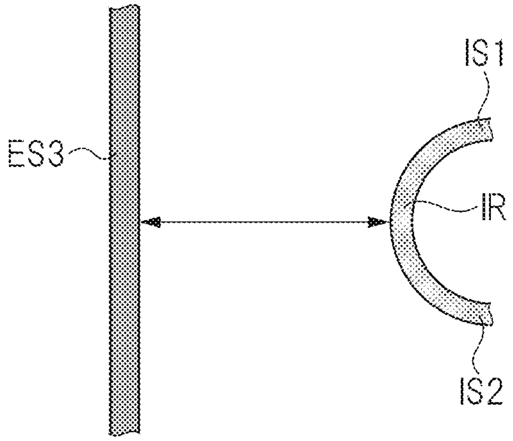
FIG. 9 is a view showing a portion including an end point of a round shape.

Subsequently, a second feature according to the embodied mode lies in such a point that, for example, as shown in FIG. 7, each corner portion of the wiring W1 in the substantially quadrangular shape is in a round shape having a curvature. Accordingly, compared to a case in which a corner portion has a shape of a right angle formed by two sides of the wiring W1, it is possible to prevent the "creeping discharge" generated from the corner portion with the corner portion as the trigger point. In this manner, the second feature according to the embodied mode lies in that each of the four corner portions of the wiring W1 is in a round shape having a curvature, and, for example, as shown in FIG. 7, even in a case in which each of the four corner portions has a round shape, it is desirable that linear portions such as the third internal side IS3 and the fourth internal side IS4 are made to remain. This is because, for example, as shown in FIG. 8, in a region in which the third internal side IS3 and the third external side ES3 are opposed to each other, the "creeping discharge" is least likely to occur between the linear portions which are parallel to each other. In other words, as shown in FIG. 9, in a case in which the entire third internal side IS3 has a round shape IR, an end point of the round shape IR easily functions as the singular point, and the "creeping discharge" is more likely to occur in the case shown in FIG. 9 than the configuration shown in FIG. 8.

First Modification

Figure 10:
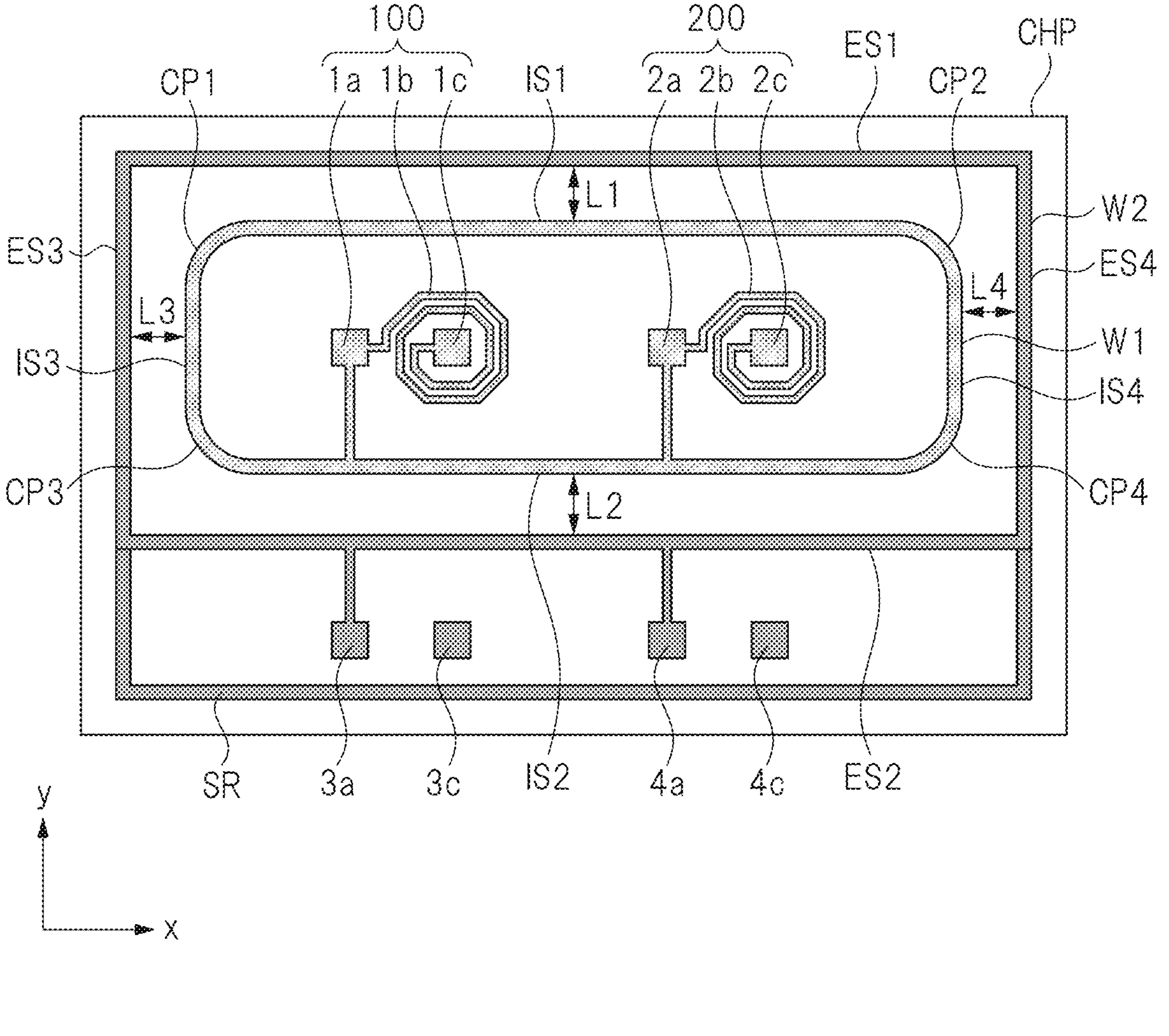
FIG. 10 is a view showing a semiconductor chip according to a first modification.

FIG. 10 is a view showing a semiconductor chip CHP according to a first modification.

As shown in FIG. 10, an outer edge portion of the semiconductor chip CHP has a sealing ring SR formed in the multilayer wiring layer, and the wiring W2 and the sealing ring SR are integrally formed. The sealing ring SR is formed so as to surround the upper inductor 100, the upper inductor 200, the wiring W1, and the pads (the tap pad 3*a*, the transformer pad 3*c*, the tap pad 4*a*, and the transformer pad 4*c*). The sealing ring SR shares any three sides of the wiring W2. Thus, the wiring W2 may be formed integrally with the sealing ring SR. Accordingly, it is possible to prevent generation of a crack in the semiconductor chip CHP.

Second Modification

According to the embodied mode, an example configured such that the reference potential of approximately 800 V is applied to the wiring W1 and the reference potential of approximately 0 V is applied to the wiring W2 has been described. In this regard, the technical idea according to the embodied mode is not limited to this example and may be configured such that the reference potential of approximately 0 V is applied to the wiring W1 and the reference potential of approximately 800 V is applied to the wiring W2, for example.

Third Modification

Figure 11:
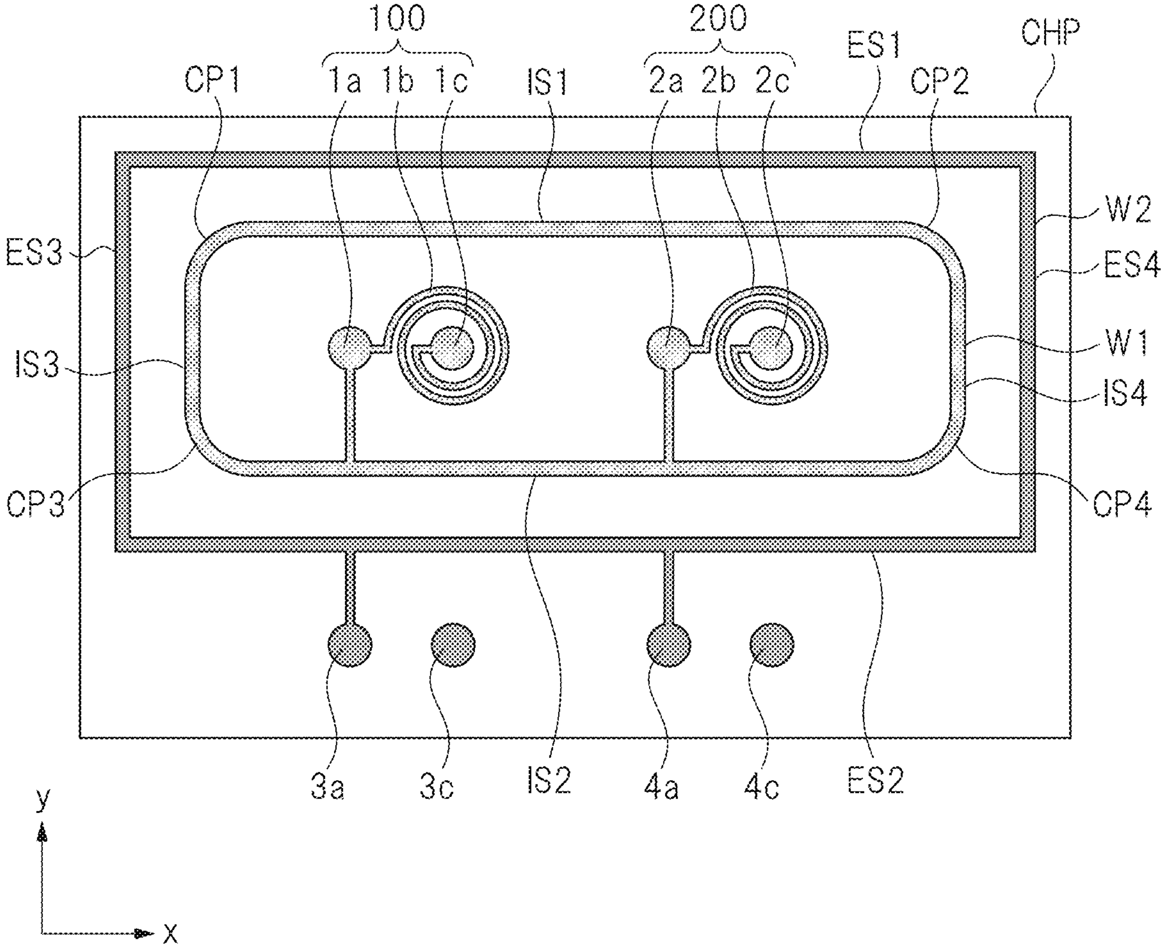
FIG. 11 is a view showing a semiconductor chip according to a third modification.

FIG. 11 is a view showing a semiconductor chip CHP according to a third modification.

As shown in FIG. 11, the tap pad 1*a* and the transformer pad 1*c* of the upper inductor 100 may each be a planar shape (circular shape) having a curvature. Similarly, the tap pad 2*a* and the transformer pad 2*c* of the upper inductor 200 may each be a planar shape (circular shape) having a curvature. In addition, the spiral wiring 1*b* of the upper inductor 100 and the spiral wiring 2*b* of the upper inductor 200 may be configured to have a curvature. Moreover, the tap pad 3*a*, the tap pad 4*a*, the transformer pad 3*c*, and the transformer pad 4*c* may each be a planar shape (circular shape) having a curvature.

Note that, in FIG. 11, from a perspective of effectively preventing the "creeping discharge," it is desirable that the curvature of each of the crossing portions CP1 to CP4 is smaller than the curvature of each of the spiral wirings (1*b* and 2*b*), the tap pads (1*a*, 2*a*, 3*a*, and 4*a*), and the transformer pads (1*c*, 2*c*, 3*c*, and 4*c*).

Fourth Modification

Figure 12A:
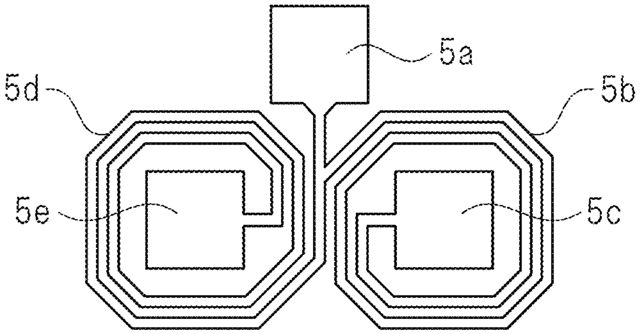
FIG. 12A is a view showing a shape of an inductor.
Figure 12B:
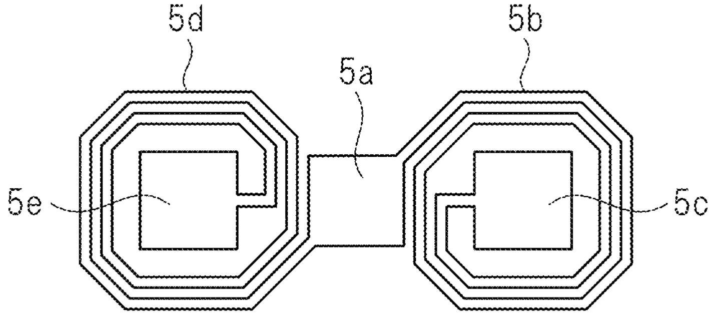
FIG. 12B is a view showing a shape of an inductor.

The inductor may have a shape capable of dealing with differential control. In particular, the planar shape of the inductor may be a planar shape shown in FIG. 12A and FIG. 12B, for example. More specifically, as shown in FIG. 12A and FIG. 12B, the inductor may include a central tap pad 5*a*, a spiral wiring 5*b*, a transformer pad 5*c*, a spiral wiring 5*d*, and a transformer pad 5*e*, in such a manner corresponding to a pair of differential wirings.

In the foregoing, the invention made by the inventor of the present invention has been concretely described based on the embodiments. However, it is needless to say that the present invention is not limited to the foregoing embodiments and various modifications and alterations can be made within the scope of the present invention.

What is claimed is:

1. A semiconductor device comprising:

a multilayer wiring layer;

a lower inductor formed in the multilayer wiring layer;

an upper inductor formed on the multilayer wiring layer so as to overlap with the lower inductor, in plan view;

a first wiring formed on the multilayer wiring layer so as to surround the upper inductor, in plan view; and a second wiring formed on the multilayer wiring layer so as to surround the first wiring, in plan view, wherein the first wiring is configured such that a first reference potential is applied thereto, wherein the second wiring is configured such that a second reference potential different from the first reference potential is applied thereto, wherein the first wiring includes:

a first side and a second side each extending in a first direction, and a third side and a fourth side each extending in a second direction intersecting with the first direction, and wherein the second wiring includes:

a fifth side and a sixth side each extending in the first direction, and a seventh side and an eighth side each extending in the second direction, wherein the lower inductor is electrically connected with a second tap pad and a second transformer pad which are disposed on the multilayer wiring layer via a wiring formed in the multilayer wiring layer, wherein the fifth side, the sixth side, the seventh side, or the eighth side is disposed between the second tap pad and the first wiring, in plan view, and wherein the second tap pad is electrically connected with the second wiring.

2. The semiconductor device according to claim 1, wherein, in a case in which a distance between the first side and the fifth side, a distance between the second side and the sixth side, a distance between the third side and the seventh side, and a distance between the fourth side and the eighth side are set as a first distance, a second distance, a third distance, and a fourth distance, respectively, the first distance, the second distance, the third distance, and the fourth distance are equal to each other.

3. The semiconductor device according to claim 1, wherein a crossing portion of the first side and the third side has a curvature, wherein a crossing portion of the first side and the fourth side has a curvature, wherein a crossing portion of the second side and the third side has a curvature, and wherein a crossing portion of the second side and the fourth side has a curvature.

4. The semiconductor device according to claim 1, comprising:

a sealing ring formed in the multilayer wiring layer, wherein the second wiring is electrically connected with the sealing ring.

5. The semiconductor device according to claim 1, wherein each of the second tap pad and the second transformer pad has a planar shape having a curvature.

6. The semiconductor device according to claim 1, wherein the upper inductor includes:

a first tap pad, a spiral wiring connected with the first tap pad, and a first transformer pad disposed inside the spiral wiring and connected with the spiral wiring, in plan view, and wherein the first tap pad is connected with the first wiring.

7. The semiconductor device according to claim 6, wherein a crossing portion of the first side and the third side has a first curvature, wherein a crossing portion of the first side and the fourth side has the first curvature, wherein a crossing portion of the second side and the third side has the first curvature, wherein a crossing portion of the second side and the fourth side has the first curvature, wherein the spiral wiring has a planar shape having a second curvature, and wherein the first curvature is smaller than the second curvature.

8. The semiconductor device according to claim 6, wherein each of the first tap pad, the spiral wiring, and the first transformer pad has a planar shape having a curvature.

* * * * *